United States Patent [19]
Erskine, Jr.

[11] Patent Number: 5,510,650
[45] Date of Patent: Apr. 23, 1996

[54] LOW MECHANICAL STRESS, HIGH ELECTRICAL AND THERMAL CONDUCTANCE SEMICONDUCTOR DIE MOUNT

[75] Inventor: James C. Erskine, Jr., Birmingham, Mich.

[73] Assignee: General Motors Corporation, Detroit, Mich.

[21] Appl. No.: 300,088

[22] Filed: Sep. 2, 1994

[51] Int. Cl.$^6$ .............................. H01L 23/04; H01L 23/48
[52] U.S. Cl. ........................ 257/707; 257/718; 257/748; 257/747
[58] Field of Search .................................. 257/717, 718, 257/719, 720, 706, 707, 712, 747, 748

[56] References Cited

U.S. PATENT DOCUMENTS

| | | | |
|---|---|---|---|
| 2,927,953 | 3/1960 | Staller | 257/747 |
| 3,128,419 | 4/1964 | Waldkötter et al. | 257/747 |
| 4,315,591 | 2/1982 | Houston | 257/719 |
| 4,333,102 | 6/1982 | Jester et al. | 257/701 |
| 4,407,006 | 9/1983 | Holick et al. | 257/747 |
| 4,952,999 | 8/1990 | Robinson et al. | 257/676 |

FOREIGN PATENT DOCUMENTS

| | | | |
|---|---|---|---|
| 0002645 | 1/1981 | Japan | 257/747 |

OTHER PUBLICATIONS

Burgess et al., "Solder Fatigue Problems in Power Packages", IEEE Transactions on Components . . . , vol. CHMT-7, No. 4, Dec. 1984, pp. 405–410.

Glascock, II et al., "Structured Copper: A Pliable High Conductance Material for Bonding to Silicon Power Devices", IEEE Transactions on Components . . . , vol. CHMT-6, No. 4, Dec. 1984, pp. 460–466.

*Primary Examiner*—Robert P. Limanek
*Assistant Examiner*—David B. Hardy
*Attorney, Agent, or Firm*—Cary W. Brooks

[57] ABSTRACT

This invention includes semiconductor devices including the heat sink with a slitted metal strip, such as copper, which is coiled or folded to produce an array of flexible flat fingers for mechanical, thermal and electrical contact with the silicon die, such as a power transistor. The use of a slitted metal strip instead of a bundle of wires makes fabrication of the flexible mount simpler and more economical. The flexible flat fingers are able to accommodate hot spots on the semiconductor device and change in thermal gradients as the device is operated. The slitted metal strip reduces mechanical stress on the die and the die attach solder to avoid solder fatigue which is a wear-out, mechanism that can cause failure of the semiconductor device; keep the magnitude of mechanical stresses from becoming large enough to fracture the silicon die; permit the use of higher melting temperature hard solders which are more resistant to solder fatigue; and permit peak operating temperatures of the semiconductor device to be higher than possible with devices that are mounted with soft die attach solder.

5 Claims, 2 Drawing Sheets

LOW MECHANICAL STRESS, HIGH ELECTRICAL AND THERMAL CONDUCTANCE SEMICONDUCTOR DIE MOUNT

FIELD OF THE INVENTION

This invention relates to semiconductor devices including die mounts, and more particularly a die mount constructed from a slitted metal strip such as copper.

BACKGROUND OF THE INVENTION

The function of an electronic package is to permit handling and installation of the electronic components without damage, and to protect the components from environmental factors such as moisture and corrosive agents. It must also provide a pathway to the environment for the electrical current controlled by the device and for heat generated by components within the package. The package of an electronic device or module is basically any part of the module except the silicon die. The package includes, for example, the die attach solder, heat spreader, any electrical insulator such as BeO, heat sink, bond wires, interconnections and connectors, and the housing. The cost of the packaging is usually greater than the cost of the silicon devices within the package and the quality of the package influences the performance and reliability of the device or module as well as the price.

The extraction of heat generated by components within the package is necessary to prevent those components from reaching a temperature where their reliability is adversely affected. This is a particularly important problem for modules which contain power transistors which can dissipate tens of watts of energy during their normal operation and require low resistance electrical contacts to minimize parasitic power losses. The electrical resistance of the packaging must be much lower than the on resistance of the power transistor die so that the voltage drop of the packaged device is minimal and determined primarily by the die on-resistance. The thermal expansion coefficients of the various materials making up the package must be well matched to avoid excessive mechanical stresses which could rupture the electrical and thermal interfaces and cause failure.

High power solid state devices, such as transistors, diodes, and silicon controlled rectifiers, commonly utilize the so-called vertical structure where the current passes vertically through the die from top side contact to the bottom side die mount (FIG. 1). The mechanical contact made by the die mount to the die must accommodate the mechanical stresses that develop when the die and the die mount are at a temperature different from the die attach solder solidification temperature and when the temperature of the die and die mount thermally cycle during normal operation. The stress relief function is a particularly demanding one in that the solder die attach layer plastically deforms to limit the stress transmitted to the die. This plastic deformation introduces structural defects, point defects and dislocations, which will ultimately lead to mechanical fatigue and failure of the die attach layer. Mechanical fatigue of the die attach solder can be reduced by using a harder, less pliable solder, but with the penalty of increasing the mechanical stresses applied to the die. In worse case situations, the stresses can become large enough to fracture the die, resulting in failure of the device and usually the circuit in which it is embedded. This is particularly true for large power transistor die. Industry rule of thumb is that the largest die that can be directly soldered to a solid copper heat sink that is about 0.63 to 0.76 cm (0.25 to 0.3 inch) square. Many man years of research and development have been invested in improving the reliability of power transistor packages, the die attach solder in particular, to achieve a transistor operating life in excess of the useful life of the circuits in which they are used. However, the package will ultimately fail because the principal failure mode, solder fatigue, is built into the structure of the package.

In a study of solder fatigue by Vaynman and McKeown, "Energy-Based Methodology for the Fatigue Life Prediction of Solder Materials," IEEE Transactions On Components, Hybrids, and Manufacturing Technology, Vol. 16, No. 3, pp. 317, 1993, the number of shear stress-strain cycles a solder joint can experience before failing is correlated with the damage to the solder caused by the deformation. Shear stress-strain cycles are a natural consequence of the temperature cycling a component experiences in normal operation. The damage function is defined as the product of the shear stress and the shear strain, i.e., the work performed on the solder in the plastic deformation cycle. With repeated cycling, the damage accumulates and the joint fails. Reducing shear strain reduces solder damage, and extends solder joint life. The shear strain is reduced by reducing the shear stress.

To improve die attach reliability and increase operating life, it is desirable to decouple the electrical and thermal contact function from the stress accommodation function. This would make a wider parameter space available for packaging power electronic systems. One could envision several ways to achieve this decoupling—use a liquid metal contact between die and heat sink, with the risk that the die could be dislodged by shock or vibration, or by making a dry pressure contact between die and heat sink, but dry contacts have higher electrical and thermal resistance.

The use of copper wire bundles in place of solid copper heat sinks to relieve stress on power transistor die was first reported by H. H. Glascock and H. F. Webster, "Structured Copper: A Pliable High Conductance Material for Bonding to Silicon Power Devices", IEEE Transactions on Components, Hybrids, and Manufacturing Technology, Vol. CHMT-6, No. 4, pp. 460–466, 1983. J. F. Burgess, R. O. Carlson, H. H. Glascock, II, C. A. Neugebauer, and H. F. Webster, "Solder Fatigue in Power Packages", IEEE Transactions on Components, Hybrids, and Manufacturing Technology, Vol. CHMT-7, No. 4, pp. 405, 1984, also discloses packaging arrangements of interest. Glascock and Webster were concerned with packaging the very large (several square inches in area) power devices used in electric power transmission equipment. They prepared their wire bundles by winding skeins of copper wire, inserting the skein in a copper tube, and drawing the tube to compress the wires tightly together. Their test results clearly showed the effectiveness of this concept in minimizing the stresses on very large die and significantly extending, their reliable operating life. However, the complexity and time consuming nature of the process used to prepare the copper wire bundles evidently intimidated others in the field because there have been no other reports in the literature exploring this novel concept in the eleven years since the publication of their results.

The present invention overcomes many of the disadvantages of the prior art.

SUMMARY OF THE INVENTION

This invention includes semiconductor devices including a die mount made with a slitted metal strip, such as copper, silver, platinum, nickel and mixtures thereof, which is coiled or folded to produce an array of flexible flat fingers for mechanical, thermal and electrical contact with a silicon die, such as a power transistor. The use of a slitted metal strip instead of a bundle of wires makes fabrication of the flexible mount simpler. The flexible flat fingers are able to accommodate hot spots on the semiconductor device and change in thermal gradients as the device is operated. The slitted metal strip reduces mechanical stress on the die and the die attach solder to avoid solder fatigue which is a wear-out mechanism that can cause failure of the semiconductor device; keep the magnitude of mechanical stresses from becoming large enough to fracture the silicon die; permit the use of higher melting temperature hard solders which are more resistant to solder fatigue; and permit peak operating temperatures of the semiconductor device to be higher than possible with devices that are mounted with soft die attach solder.

These and other objects, features and advantages of the present invention will become apparent from the following brief description of the drawings, detailed description and appended claims and drawings.

DETAILED DESCRIPTION

The present invention includes a slitted metal strip, such as copper silver, platinum, nickel and mixtures thereof, which can be coiled or folded to produce the array of flexible arms for mechanical, thermal and electrical contact to a semiconductor device. Using a copper strip instead of a bundle of copper wires makes fabricating the flexible die mount simpler than previous approaches.

Figure 1:
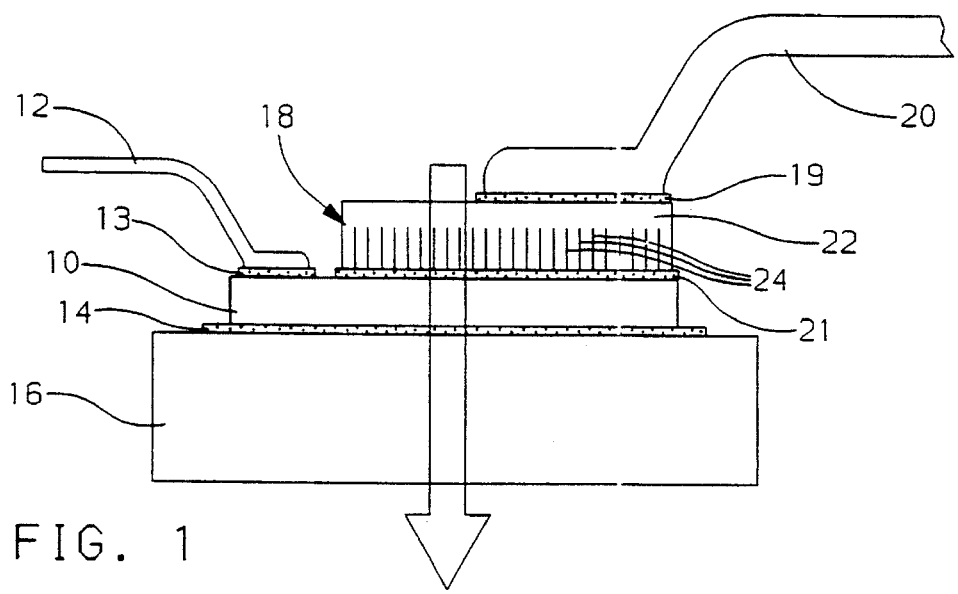
FIG. 1 illustrates the current flow in a vertical power transistor including a die mount according to the present invention.

FIG. 1 illustrates a semiconductor device according to the present invention which may be a vertical power transistor, Where the current passes vertically through the die mount (current flows in the direction of the arrow). Such a device may include a silicon power transistor die 10, and a first wire 12 making connection through a solder layer 13 with a gate contact on the die. A die attach solder layer 14 connects the die to a die mount 16 which provides a drain contact. A top side die mount 18 is soldered 19 to a second wire 20 and soldered 21 to a source contact on the die 10. The fingers 25 of the second die mount are positioned to contact the die.

Figure 2A:
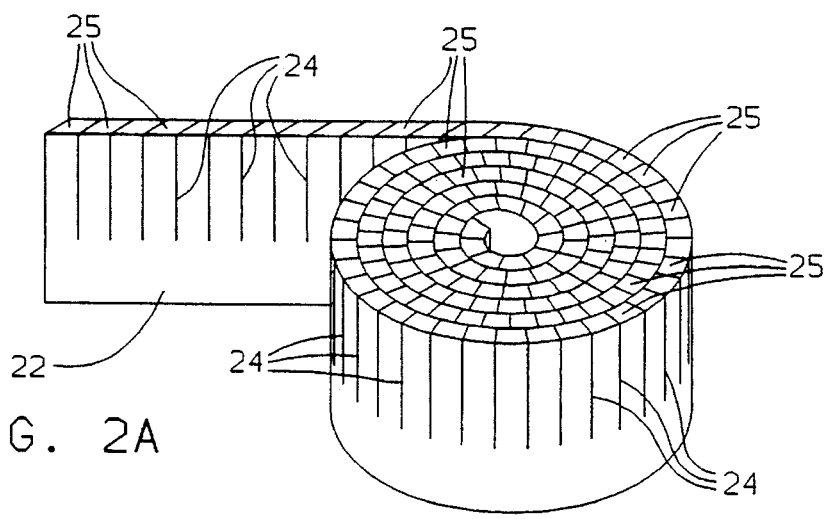
FIGS. 2A and 2B, illustrate slitted strips of metal used in the heat sink according to the present invention.
Figure 2B:
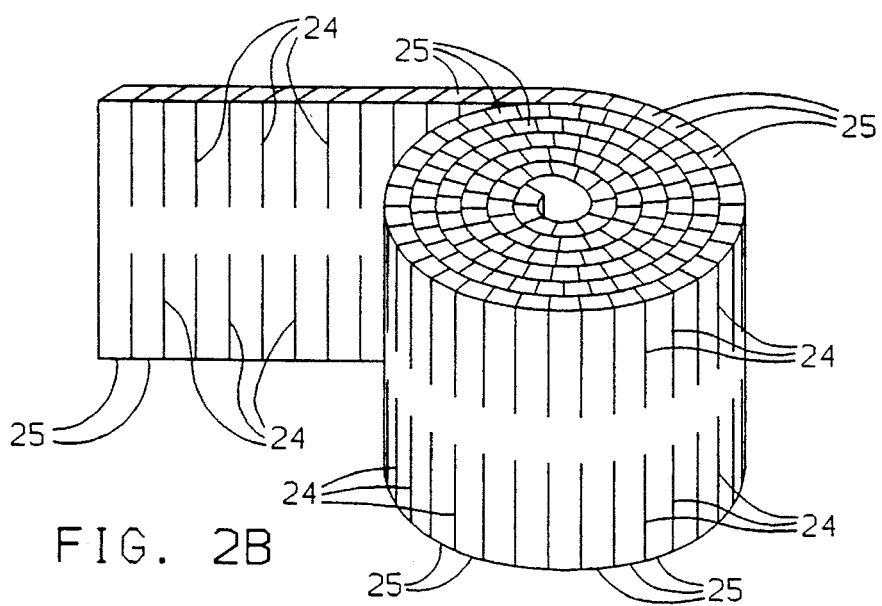

We start with a strip of copper 22 whose width is equal to the thickness of the desired die mount. The thickness of the copper strip is kept thin to keep the mechanical compliance high. Strip thicknesses down to 0.002 inch (0.051 mm) are routinely available from the supplier industry and thicknesses down to 0.0005 inch (0.013 mm) are available from specialty suppliers. The strip may have a variety thicknesses, for example ranging from 0.01" to 0.002" to 0.0005". In general, the thinner the strip the lower the mechanical die attach solder stress. To obtain high mechanical compliance perpendicular to, the plane of the strip, slits 24 are made part way through the strip at regular intervals, every 0.5 mm for example (FIGS. 2A and 2B). The unslitted portion of the copper strip holds the slit portions together. Slitting can be accomplished with a roller die. The slits may be perpendicular to the longitudinal axis of the strip, or they may be angled with respect to the longitudinal axis to increase their length and further lower the die attach solder stress on the device. The strip is oxidized to create a solder resist layer on the surfaces of the strip, including the slits. This oxidation could be done most economically in an additional process immediately following the slitting operation. Other solder resist coatings, such as a plated chromium coating or a varnish such as that used to insulate magnet wire, could be used in place of the oxide solder resist layer. The resist coating must be stable at the soldering temperature and not stick to the adjacent copper strips. The strip is then folded or coiled to the desired size. The term "coil" means a series of connected concentric rings formed by gathering or winding. The term "folded" means to bend over or double up so that one part lies on another part. The end of the coiled or folded strip is attached to the preceding ring or layer by tacking or glue to keep the coil or folded strip tightly held together. Coiling is particularly attractive in that once coiled, the sample can be easily handled and no further cutting is required because the thickness of the coil is set by the thickness of the copper strip and the number of turns. If the copper was not oxidized immediately after slitting, it would be done at this point. After oxidation, the solder surfaces (die mounting face and package mounting face) have to be cleaned of oxide, by sanding for example, in order to solder at those locations. A nickel plated layer can be applied to the cleaned surface to prevent formation of brittle Cu-Sn intermetallic compounds with the solder.

Coiling allows one to make die mounts of the desired size one at a time. One could also make a coil the size of the silicon wafer which could be soldered to the wafer before it is cut into individual die. The wafer size coil would be separated into individual die mounts bonded to the die during the wafer sawing operation. This would simplify the attachment of the die mount to the die since all die would be bonded to the flexible die mount simultaneously. If the top side of a die is metallized, for example in a vertical transistor or diode, a top side contact can be formed with the slitted die mount according to the present invention. Such top side contact (or die mount) 18 will lower total package resistance and could provide an additional thermal path way to remove heat dissipated in the die. This contributes to cooler operation and high reliability.

Figure 3:
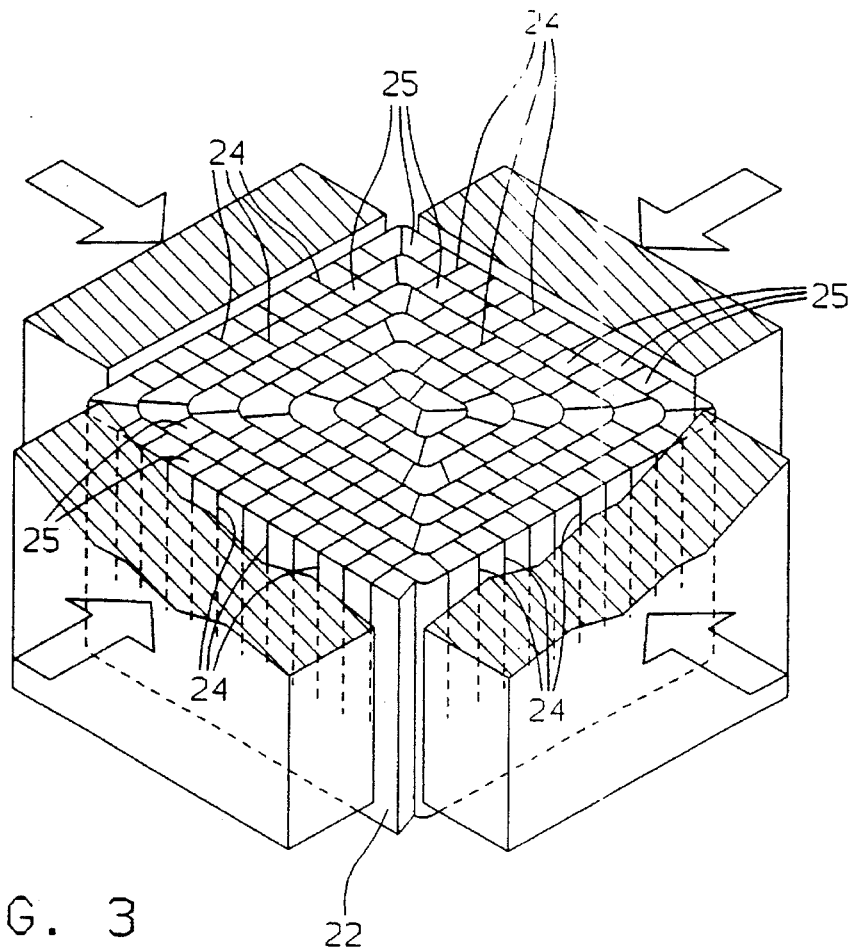
FIG. 3 illustrates the process of pressing a coiled, slitted strip of metal into a rectangular die mount according to the present invention.

The coiling process produces round die mounts that may not be acceptable for mounting square or rectangular die. The unused copper area adds cost to the die mount and there may not be space available in the package or module for a round mount. To avoid this problem, after coiling, the round die mount may be pressed into a square or rectangular shape to more closely conform to the die dimensions as illustrated in FIG. 3. Uniaxial pressure may be applied to collapse the hole in the center of the coil left by the coiling mandrel.

For applications Where minimum electrical and thermal resistance is not required, one could use unslitted copper strip and then cut multiple slits the surface of the completed coil using an abrasive cutoff wheel or electro-discharge machining (EDM). This would give a die mount with lower copper "fill factor" but retains the high mechanical compliance. This approach might be suitable for mounting semiconductor devices like large microprocessors, micromechanical sensors, and safety-related electronics chips (air bags, ABS, traction control) where low mechanical stress is required for high reliability even though the electrical and thermal loads are not large.

The approach to making a flexible copper die mount using coiled or folded copper strip is simpler than the fabrication process conceived for copper wires and has comparable electrical, thermal, and mechanical performance to the die mount made from copper wires. The strip-based approach will allow the easy fabrication of die mounts to any specified size up to and including full wafer size.

The coiled die mount according to the present invention is made by the following steps. A strip of copper is slitted along at least one of the edges and the strip is oxidized. The strip is then wound into a coil. The end of the coil is attached to the previous layer with adhering solder or welded to hold the coil together. Solder faces of the strip are sanded to remove the oxide. Optionally, the coil can be pressed into a rectangular shape. A Ni plating can be deposited on the ends of the fingers. The fingers 25 of the die mount are positioned to engage the solder layer between the die and the die mount.

Figure 4:
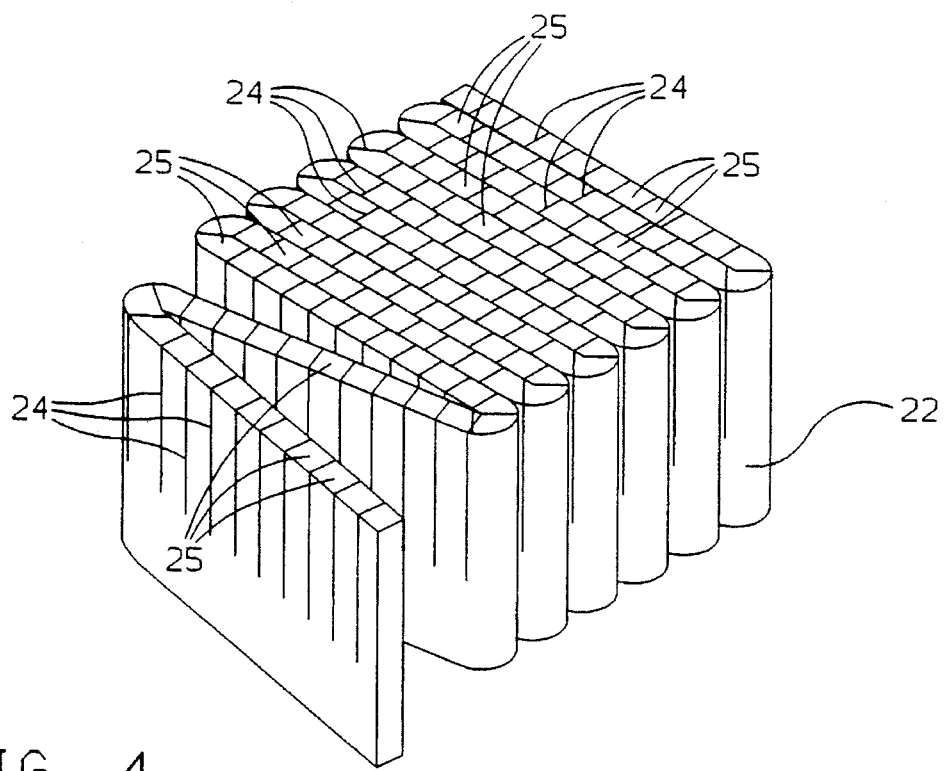
FIG. 4 illustrates the process of folding a slitted strip of metal into a rectangular die mount according to be present invention.

The folded, slitted strip die mount according to the present invention is prepared by the following steps. Again, a strip of copper is slitted along at least one of its edged (FIGS. 2A and 2B) and the strip is oxidized. The strip is repeated fold over on itself to form a rectangular shape as illustrated in FIG. 4. The folded strip is compressed in a fixture which holds its folded structure. Solder faces of the strip are sanded to remove the oxide. A binding layer is applied to the non-slitted edge of the folded strip stack to hold it together. The binding layer may be formed by electroplated copper, flame sprayed copper or other methods. The fingers 25 of the die mount are positioned to engage the solder layer between the die and die mount.

The embodiments of the invention in which an exclusive property or privilege is claimed is defined as follows:

1. A semiconductor device comprising:
   a heat generating component;
   a die mount in thermal communication with said component, said die mount comprising at least one layer comprising a strip of metal having a plurality of slits formed therein, wherein each slit extends through at least one edge of the strip toward an other edge of the strip, so that said strip includes a plurality of flat fingers so that different flat fingers can accommodate different thermal expansions associated with different areas on the heat generating component.

2. A semiconductor device as set forth in claim 1 wherein said die mount comprises a coiled strip.

3. A semiconductor device as set forth in claim 1 wherein said strip comprises a plurality of folded over portions so that one portion of the strip lies over another part.

4. A semiconductor device as set forth in claim 1 wherein said die mount is formed from a single strip.

5. A semiconductor device comprising:
   a heat generating component;
   a die mount in thermal communication with said component, said die mount comprising at least one layer comprising a strip of metal having a plurality of slits formed therein, wherein each slit extends through at least one edge of the strip toward an other edge of the strip, so that said strip includes a plurality of flat fingers so that different flat fingers can accommodate different thermal expansions associated with different areas on the heat generating component wherein said heat generating component is a silicon device having a source contact on one face and a drain contact on an opposite face, and comprising a first die mount fixed to the source contact and a second die mount fixed to the drain contact.

* * * * *